(12) United States Patent
Kim

(10) Patent No.: US 11,032,920 B2
(45) Date of Patent: Jun. 8, 2021

(54) FLEXIBLE DISPLAY DEVICE

(71) Applicant: LG ELECTRONICS INC., Seoul (KR)

(72) Inventor: Sungpil Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/692,869

(22) Filed: Nov. 22, 2019

(65) Prior Publication Data

US 2020/0170128 A1 May 28, 2020

Related U.S. Application Data

(60) Provisional application No. 62/770,840, filed on Nov. 23, 2018.

(30) Foreign Application Priority Data

Jan. 4, 2019 (KR) .......................... 10-2019-0001359

(51) Int. Cl.
| | |
|---|---|
| *H05K 7/02* | (2006.01) |
| *H05K 7/04* | (2006.01) |
| *H05K 5/00* | (2006.01) |
| *E05D 3/18* | (2006.01) |
| *H05K 5/02* | (2006.01) |

(52) U.S. Cl.
CPC ............. *H05K 5/0017* (2013.01); *E05D 3/18* (2013.01); *H05K 5/0226* (2013.01); *E05Y 2900/606* (2013.01)

(58) Field of Classification Search
USPC .......................................................... 361/809
See application file for complete search history.

(56) References Cited

U.S. PATENT DOCUMENTS

| | | | |
|---|---|---|---|
| 9,572,272 B2* | 2/2017 | Lee | H05K 5/0021 |
| 9,823,699 B2* | 11/2017 | Ko | G06F 1/1681 |
| 2016/0070303 A1* | 3/2016 | Lee | G06F 1/1652 |
| | | | 361/679.27 |
| 2019/0012028 A1* | 1/2019 | Park | G06F 1/1652 |

(Continued)

FOREIGN PATENT DOCUMENTS

| | | |
|---|---|---|
| KR | 10-2014-0111509 A | 9/2014 |
| KR | 10-2017-0006055 A | 1/2017 |

(Continued)

*Primary Examiner* — Hung S. Bui
(74) *Attorney, Agent, or Firm* — Birch, Stewart, Kolasch & Birch, LLP

(57) ABSTRACT

A flexible display device including a first body having a first surface and a second surface opposite the first surface, a second body having a first surface and a second surface opposite the first surface, the second body having a housing, a hinge portion connecting the first body and the second body in a relatively rotatable manner, and a flexible display disposed on the first surface of the first body and first surface of the second body, the flexible display being movable between a folded state and an unfolded state, the flexible display being exposed to cover the second surface of the first body together with the second body when in the folded state is provided. The housing of the second body slides with respect to the hinge portion when the flexible display is being moved between the folded state and the unfolded state.

18 Claims, 10 Drawing Sheets

(56) References Cited

U.S. PATENT DOCUMENTS

| | | | |
|---|---|---|---|
| 2019/0027703 A1* | 1/2019 | Ahn | G06F 1/16 |
| 2019/0090364 A1* | 3/2019 | Shin | G06F 1/1681 |
| 2019/0243424 A1* | 8/2019 | Lee | G06F 1/1616 |

FOREIGN PATENT DOCUMENTS

| | | |
|---|---|---|
| KR | 10-2017-0026023 A | 3/2017 |
| KR | 10-2017-0087008 A | 7/2017 |
| KR | 10-2018-0071900 A | 6/2018 |

\* cited by examiner (a)

(b)

(a)

(b)

FLEXIBLE DISPLAY DEVICE

CROSS-REFERENCE TO RELATED APPLICATIONS

Pursuant to 35 U.S.C. § 119, this application claims the benefit of an earlier filing date of and the right of priority to U.S. Provisional Application No. 62/770,840, filed on Nov. 23, 2018, and Korean Patent Application No. 10-2019-0001359, filed on Jan. 4, 2019, both of which are incorporated by reference herein in their entirety.

BACKGROUND

Technical Field

The present disclosure relates to a flexible display device having a flexible display that is deformable by an external force.

Description of the Related Art

A portable electronic device (hereinafter, mobile terminal) such as a communication terminal, a multimedia device, a portable computer, a game machine, and a photographing apparatus has a display for displaying image information. The mobile terminal may have a folding structure that can be folded to a smaller size for convenience of carrying. In this type of electronic device, two bodies are connected by a folding structure (for example, a hinge portion).

Displays in the related art have a non-foldable structure, and thus a structure in which a display is disposed over two whole bodies that are foldably connected to each other cannot be implemented. Therefore, a substantially large screen cannot be applied to an electronic device with a folding structure.

However, in recent years, as a flexible display capable of bending has been developed, research has been carried out to apply a flexible display to a mobile terminal having a folding structure. In this case, a flexible display may be disposed over two whole bodies across a folding structure, thereby implementing a large screen.

However, in the flexible display device, a flexible display may be deformed into a folded state and an unfolded state by using a hinge portion, but there is a problem of variation in deformation. In other words, in the case of bending, a phenomenon occurs in which one side is tensilely deformed and the other side is compressively deformed about a neutral axis (neutral line).

More specifically, in order to compensate for the characteristics of the display, an electronic device having a folding structure requires various considerations on a hinge operating structure (a length compensating scheme, a concealed structure, an interlocking structure for each element) for controlling a neutral plane of the display or a structure for supporting a rear surface of the display, and an operating scheme thereof.

However, in the flexible display device, a flexible display may be deformed into a folded state and an unfolded state by using a hinge portion, but there is a problem of variation in deformation. In other words, in the case of bending, a phenomenon occurs in which one side is tensilely deformed and the other side is compressively deformed about a neutral axis (neutral line).

In particular, in an outer folding type flexible display device in which a display is folded outward, it is essential to solve the foregoing problem in order to implement the display device in the form of a terminal that actually operates.

SUMMARY

A first aspect of the present disclosure is to provide a new mechanism for implementing length compensation according to folding and unfolding in a flexible display device.

A second aspect of the present disclosure is to provide a hinge structure capable of reducing a size of an outer folding type flexible display device.

A third aspect of the present disclosure is to implement a function of maintaining the flatness of a flexible display when unfolded in a flexible display device.

In order to achieve the foregoing objectives of the present disclosure, in a flexible display device, a flexible display may be disposed on an outside of the body, and a length variation of a hinge portion may be compensated through a relative sliding between the body and the hinge portion.

More specifically, the flexible display device may include a first body and a second body, a hinge portion connecting the first body and the second body in a relatively rotatable manner, and a flexible display disposed on one surface of the first body and the second body in a foldable and unfoldable manner, wherein the flexible display is exposed to the outside to cover the other surface of the first body together with the second body when folded, and at least part of the hinge portion is varied in length, and a housing of the second body relatively slides with respect to the hinge portion to compensate for a length variation of the hinge portion during the folding.

For an embodiment of the present disclosure, the hinge portion may include a plurality of hinge segments sequentially arranged along one direction, and the hinge segments may be arranged to surround one side surface of the first body during the folding.

One side surface of the first body may have a thickness greater than that of the second body. The hinge segments may be arranged such that a distance between one end portions close to the flexible display varies according to the folding and unfolding, and the first body and the second body relatively slide to compensate for the distance variation.

As the hinge segments are switched from the unfolding to the folding, a distance between the one end portions may increase with respect to the rotational center of the hinge segments, and the flexible display may be disposed to cover the one end portions.

Any one of the hinge segments may be connected to a sliding plate slidably inserted into a housing of the second body. The outermost first hinge segment of the hinge segments may be integrally formed with the sliding plate.

The flexible display may be fixed to the housing of the second body, and a sliding plate slidably connected to the housing of the second body may extend from the hinge portion to compensate for a length variation of the hinge portion.

In addition, the present disclosure proposes a new structure of an elastic force providing unit to perform the sliding operation in conjunction with the folding and unfolding of the flexible display.

For example, an elastic force providing unit that adds an elastic force to the sliding plate may be disposed in the housing of the second body. The elastic force providing unit may add an elastic force to the sliding plate in a direction away from the hinge portion, and an actuator may be connected to the sliding plate and at least part of the first body, respectively, to pull the sliding plate toward the hinge portion.

The actuator may include a plurality of extension portions extending from the first body to the sliding plate through the hinge portion, and a connection portion disposed in a direction perpendicular to the extension portion to connect the extension portions to one another. The connection portion may be coupled to the sliding plate.

For another example, the first body may be provided with a support plate connected to the actuator, and the support plate may be slidably coupled to a housing of the first body, and a spring that applies an elastic force to the support plate may be disposed in a housing of the first body.

In addition, in order to maintain the flatness of the flexible display, the present disclosure may mix a magnetic material into a flexible member and pressurize the flexible display using a magnetic force with a magnet.

More specifically, the flexible display may be provided with a bent portion that is bent by the folding, and a flexible member into which a magnetic material is mixed may be disposed on a rear surface of the flexible display to pressurize the bent portion, and a magnet may be disposed at a position separated from the flexible member when the flexible display is unfolded.

A flexible frame may be disposed on a rear surface of the flexible member, and the magnet may be disposed to be spaced apart from the flexible frame.

The effects of the present disclosure obtained through the foregoing solutions are as follows.

First, though a neutral line of a hinge portion may be located at a position spaced apart from a display line, an outer folding type flexible display device may be implemented through a length compensation structure of the present disclosure.

Second, a more compact display device may be provided through a structure in which a hinge segment is integrated with a sliding plate. In addition, a mechanism in which relative sliding between the sliding plate and the housing is interlocked with the folding and unfolding operations of a display may be implemented through an elastic force providing unit.

Third, both magnetic and elastic forces may apply a physical force to a rear surface of a flexible display when unfolded to always restore the flexible display to a flat state, thereby preventing the occurrence of a phenomenon in which the surface undulates like a wave. Therefore, the reliability of a flexible display device can be improved. Furthermore, a physical force applied when unfolded may be provided by a magnetic material mixed into a soft material, thereby allowing the maintenance of a compact structure.

DETAILED DESCRIPTION OF THE EMBODIMENTS

Figure 1A:
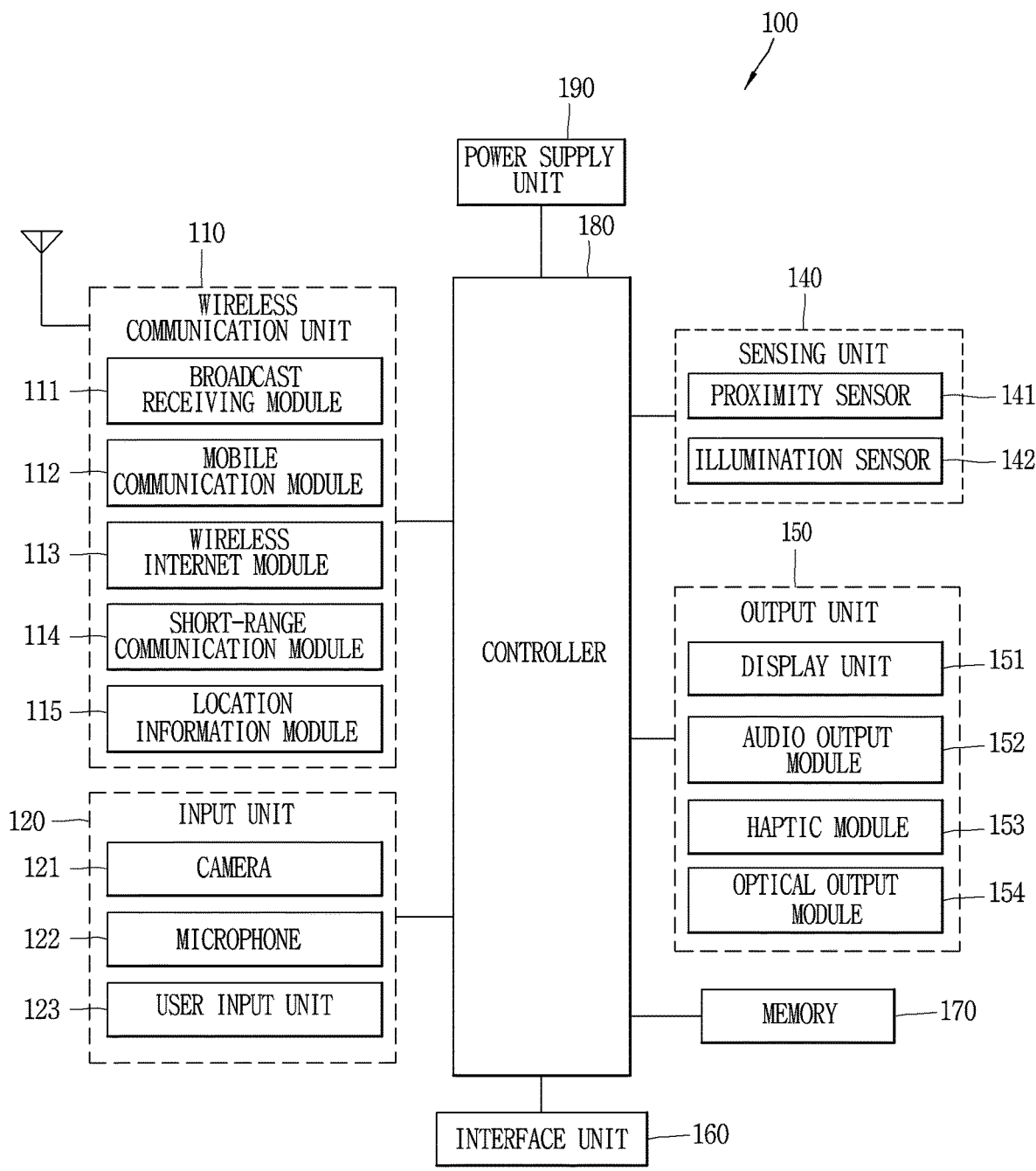
FIG. 1A is a block diagram for explaining a display device associated with the present disclosure.

Hereinafter, the embodiments disclosed herein will be described in detail with reference to the accompanying drawings, and the same or similar elements are designated with the same numeral references regardless of the numerals in the drawings and their redundant description Hereinafter, preferred embodiments of the present disclosure will be described in detail with reference to the accompanying drawings, and the same or similar elements are designated with the same numeral references and their redundant description will be omitted. A suffix "module" and "unit" used for constituent elements disclosed in the following description is merely intended for easy description of the specification, and the suffix itself does not give any special meaning or function. In describing the embodiments disclosed herein, moreover, the detailed description will be omitted when specific description for publicly known technologies to which the invention pertains is judged to obscure the gist of the present invention. The accompanying drawings are used to help easily understand the technical idea of the present disclosure and it should be understood that the idea of the present disclosure is not limited by the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. On the contrary, in case where an element is "directly connected" or "directly linked" to another element, it should be understood that any other element is not existed therebetween.

A singular representation may include a plural representation as far as it represents a definitely different meaning from the context.

Terms "include" or "has" used herein should be understood that they are intended to indicate the existence of a feature, a number, a step, a constituent element, a component or a combination thereof disclosed in the specification, and it may also be understood that the existence or additional possibility of one or more other features, numbers, steps, constituent elements, components or combinations thereof are not excluded in advance.

Display devices described herein may include cellular phones, smart phones, laptop computers, digital broadcasting terminals, personal digital assistants (PDAs), portable multimedia players (PMPs), navigators, slate PCs, tablet PCs, ultrabooks, wearable devices (for example, smart watches, smart glasses, head mounted displays (HMDs)), and the like.

However, it may be easily understood by those skilled in the art that the configuration according to the exemplary embodiments of the present specification can also be applied to stationary terminals such as digital TV, desktop computers, digital signages, and the like, excluding a case of being applicable only to the mobile terminals. Hereinafter, a mobile terminal will be described as an example of a flexible display device for convenience of description in the present specification.

FIG. 1A is a block diagram for explaining a mobile terminal associated with the present disclosure.

The mobile terminal 100 may include components, such as a wireless communication unit 110, an input unit 120, a sensing unit 140, an output unit 150, an interface unit 160, a memory 170, a controller 180, a power supply unit 190 and the like. The components shown in FIG. 1A are not essential for implementing a mobile terminal, and thus the mobile terminal described herein may have more or fewer components than those listed above.

In more detail, the wireless communication unit 110 of those components may typically include one or more modules which permit wireless communications between the mobile terminal 100 and a wireless communication system, between the mobile terminal 100 and another mobile terminal 100, or between the mobile terminal 100 and an external server. In addition, the wireless communication unit 110 may include one or more modules for connecting the mobile terminal 100 to one or more networks.

The wireless communication unit 110 may include at least one of a broadcast receiving module 111, a mobile communication module 112, a wireless Internet module 113, a short-range communication module 114, a location information module 115 and the like.

The input unit 120 may include a camera 121 for inputting an image signal, a microphone 122 or an audio input module for inputting an audio signal, or a user input unit 123 (for example, a touch key, a push key (or a mechanical key), etc.) for allowing a user to input information. Audio data or image data collected by the input unit 120 may be analyzed and processed by a user's control command.

The sensing unit 140 may include at least one sensor which senses at least one of internal information of the mobile terminal, a surrounding environment of the mobile terminal and user information. For example, the sensing unit 140 may include a proximity sensor 141, an illumination sensor 142, a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, refer to the camera 121), a microphone 122, a battery gage, an environment sensor (for example, a barometer, a hygrometer, a thermometer, a radiation detection sensor, a thermal sensor, a gas sensor, etc.), and a chemical sensor (for example, an electronic nose, a health care sensor, a biometric sensor, etc.). On the other hand, the mobile terminal disclosed herein may use information in such a manner of combining information sensed by at least two sensors of those sensors.

The output unit 150 may be configured to output an audio signal, a video signal or a tactile signal. The output unit 150 may include a display 151, an audio output module 152, a haptic module 153, an optical output unit 154 and the like. The display 151 may have an inter-layered structure or an integrated structure with a touch sensor in order to facilitate a touch screen. The touch screen may provide an output interface between the mobile terminal 100 and a user, as well as functioning as the user input unit 123 which provides an input interface between the mobile terminal 100 and the user.

The interface unit 160 may serve as an interface with various types of external devices connected with the mobile terminal 100. The interface unit 160, for example, may include wired or wireless headset ports, external power supply ports, wired or wireless data ports, memory card ports, ports for connecting a device having an identification module, audio input/output (I/O) ports, video I/O ports, earphone ports, or the like. The mobile terminal 100 may execute an appropriate control associated with a connected external device, in response to the external device being connected to the interface unit 160.

In addition, the memory 170 stores data that support various functions of the mobile terminal 100. The memory 170 is typically implemented to store data to support various functions or features of the mobile terminal 100. For instance, the memory 170 may be configured to store application programs executed in the mobile terminal 100, data or instructions for operations of the mobile terminal 100, and the like. At least some of those application programs may be downloaded from an external server via wireless communication. Some others of those application programs may be installed within the mobile terminal 100 at the time of being shipped for basic functions of the mobile terminal 100 (for example, receiving a call, placing a call, receiving a message, sending a message, etc.). On the other hand, the application programs may be stored in the memory 170, installed in the mobile terminal 100, and executed by the controller 180 to perform an operation (or a function) of the mobile terminal 100.

The controller 180 may typically control an overall operation of the mobile terminal 100 in addition to the operations associated with the application programs. The controller 180 may provide or process information or functions appropriate for a user in a manner of processing signals, data, information and the like, which are input or output by the aforementioned components, or activating the application programs stored in the memory 170.

Furthermore, the controller 180 may control at least part of the components illustrated in FIG. 1A, in order to drive the application programs stored in the memory 170. In addition, the controller 180 may drive the application programs by combining at least two of the components included in the mobile terminal 100 for operation.

The power supply unit 190 may receive external power or internal power and supply appropriate power required for operating respective elements and components included in the mobile terminal 100 under the control of the controller 180. The power supply unit 190 may include a battery, and the battery may be an embedded battery or a replaceable battery.

At least part of those elements and components may be combined to implement operation and control of the mobile terminal or a control method of the mobile terminal according to various exemplary embodiments described herein. Furthermore, the operation and control or the control method of the mobile terminal may be implemented in the mobile terminal in such a manner of activating at least one application program stored in the memory 170.

Hereinafter, each aforementioned component will be described in more detail with reference to FIG. 1A, prior to explaining various exemplary embodiments implemented by the mobile terminal 100 having the configuration.

First, the wireless communication unit 110 will be described. The broadcast receiving module 111 of the wireless communication unit 110 may receive a broadcast signal and/or broadcast associated information from an external broadcast managing entity via a broadcast channel. The broadcast channel may include a satellite channel and/or a terrestrial channel. At least two broadcast receiving modules 111 may be provided in the mobile terminal 100 to simultaneously receive at least two broadcast channels or switch the broadcast channels.

The broadcast management server may mean a server that generates and transmits a broadcast signal and/or broadcast associated information or a server that receives a previously generated broadcast signal and/or broadcast associated information and transmits to the mobile terminal 100. The broadcast signal may include a TV broadcast signal, a radio broadcast signal and a data broadcast signal as well as a broadcast signal in a form that a data broadcast signal is coupled to the TV or radio broadcast signal.

The broadcast signal may be encoded according to at least one of technical standards (or broadcasting methods, e.g., ISO, IEC, DVB, ATSC, etc.) for transmission and reception of digital broadcast signals. The broadcast receiving module 111 may receive the digital broadcast signals using a method appropriate for a technical specification defined in the technical standards.

The broadcast associated information may mean information regarding a broadcast channel, a broadcast program, a broadcast service provider, and the like. The broadcast associated information may also be provided through a mobile communication network. The broadcast associated information may be provided via a mobile communication network, and received by the mobile communication module 112.

The broadcast associated information may be implemented in various formats. For instance, broadcast associated information may include an Electronic Program Guide (EPG) of Digital Multimedia Broadcasting (DMB), an Electronic Service Guide (ESG) of Digital Video Broadcast-Handheld (DVB-H), and the like. Broadcast signals and/or broadcast associated information received via the broadcast receiving module 111 may be stored in a memory 160.

The mobile communication module 112 may transmit/receive wireless signals to/from at least one of network entities, for example, a base station, an external terminal, a server, and the like, on a mobile communication network, which is constructed according to technical standards or transmission methods for mobile communications (for example, Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), Long Term Evolution-Advanced (LTE-A), etc.)

Here, the wireless signals may include audio call signal, video (telephony) call signal, or various formats of data according to transmission/reception of text/multimedia messages.

The wireless Internet module 113 refers to a module for supporting wireless Internet access, and may be built-in or externally installed on the mobile terminal 100. The wireless Internet module 113 may transmit and/or receive wireless signals via communication networks according to wireless Internet technologies.

Examples of such wireless Internet access may include Wireless LAN (WLAN), Wireless-Fidelity (Wi-Fi), Wireless Fidelity Direct (Wi-Fi Direct), Digital Living Network Alliance (DLNA), Wireless Broadband (WiBro), World Interoperability for Microwave Access (WiMAX), High Speed Downlink Packet Access (HSDPA), High Speed Uplink Packet Access (HSUPA), LTE (Long Term Evolution), LTE-A (Long Term Evolution-Advanced), and the like. The wireless Internet module 113 may transmit/receive data according to at least one wireless Internet technology within a range including even Internet technologies which are not aforementioned.

From the perspective that the wireless Internet accesses according to Wibro, HSDPA, GSM, CDMA, WCDMA, LTE, LTE-A and the like are executed via a mobile communication network, the wireless Internet module 113 which performs the wireless Internet access via the mobile communication network may be understood as a type of the mobile communication module 112.

The short-range communication module 114 denotes a module for short-range communications. Suitable technologies for implementing the short-range communications may include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, and the like. The short-range communication module 114 may support wireless communications between the mobile terminal 100 and a wireless communication system, between the mobile terminal 100 and another mobile terminal 100, or between the mobile terminal and a network where another mobile terminal 100 (or an external server) is located, via wireless personal area networks. The short-range communication module 114 denotes a module for short-range communications.

Here, the another mobile terminal 100 may be a wearable device, for example, a smart watch, smart glasses or a head mounted display (HMD), which is able to exchange data with the mobile terminal 100 (or to link data with the mobile terminal 100). The short-range communication module 114 may sense (recognize) a wearable device, which is able to communicate with the mobile terminal), near the mobile terminal 100. In addition, when the sensed wearable device is a device which is authenticated to communicate with the mobile terminal 100 according to the present disclosure, the controller 180 may transmit at least part of data processed in the mobile terminal 100 to the wearable device via the short-range communication module 114. Hence, a user of the wearable device may use the data processed in the mobile terminal 100 on the wearable device. For example, when a call is received in the mobile terminal 100, the user may answer the call using the wearable device. Also, when a message is received in the mobile terminal 100, the user can check the received message using the wearable device.

The location information module 115 is generally configured to detect, calculate, derive or otherwise identify a position of the mobile terminal. As an example, the location information module 115 includes a Global Position System (GPS) module, a WiFi module, or both. For example, when the mobile terminal uses the GPS module, a position of the mobile terminal may be acquired using a signal sent from a GPS satellite. For another example, when the mobile terminal uses the Wi-Fi module, a position of the mobile terminal may be acquired based on information associated with a wireless access point (AP) which transmits or receives a wireless signal to or from the Wi-Fi module. According to the need, the location information module 115 may perform any function of the other modules of the wireless communication unit 110 to obtain data on the location of the mobile terminal. As a module used to acquire the location (or current location) of the mobile terminal, the location information module 115 may not be necessarily limited to a module for directly calculating or acquiring the location of the mobile terminal.

The input unit 120 may be configured to provide an audio or video signal (or information) input to the mobile terminal or information input by a user to the mobile terminal. For the input of the audio information, the mobile terminal 100 may include one or a plurality of cameras 121. The camera 121 processes an image frame, such as still picture or video, acquired by an image sensor in a video phone call or image capturing mode. The processed image frames may be displayed on the display 151. On the other hand, the plurality of cameras 121 disposed in the mobile terminal 100 may be arranged in a matrix configuration. By use of the cameras 121 having the matrix configuration, a plurality of image information having various angles or focal points may be input into the mobile terminal 100. As another example, the cameras 121 may be located in a stereoscopic arrangement to acquire left and right images for implementing a stereoscopic image.

The microphone 122 may process an external audio signal into electric audio data. The processed audio data may be utilized in various manners according to a function being executed in the mobile terminal 100 (or an application program being executed). On the other hand, the microphone 122 may include assorted noise removing algorithms to remove noise generated in the course of receiving the external audio signal.

The user input unit 123 may receive information input by a user. When information is input through the user input unit 123, the controller 180 may control an operation of the mobile terminal 100 to correspond to the input information. The user input unit 123 may include one or more of a mechanical input element (for example, a key, a button located on a front and/or rear surface or a side surface of the mobile terminal 100, a dome switch, a jog wheel, a jog switch, and the like), or a touch-sensitive input, among others. As one example, the touch-sensitive input may be a virtual key or a soft key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

On the other hand, the sensing unit 140 may sense at least one of internal information of the mobile terminal, surrounding environment information of the mobile terminal and user information, and generate a sensing signal corresponding to it. The controller 180 may control an operation of the mobile terminal 100 or execute data processing, a function or an operation associated with an application program installed in the mobile terminal based on the sensing signal. Hereinafter, description will be given in more detail of representative sensors of various sensors which may be included in the sensing unit 140.

First, a proximity sensor 141 refers to a sensor to sense presence or absence of an object approaching to a surface to be sensed, or an object disposed near a surface to be sensed, by using an electromagnetic field or infrared rays without a mechanical contact. The proximity sensor 141 may be arranged at an inner region of the mobile terminal covered by the touch screen, or near the touch screen.

The proximity sensor 141, for example, may include any of a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and the like. When the touch screen is implemented as a capacitance type, the proximity sensor 141 may sense proximity of a pointer to the touch screen by changes of an electromagnetic field, which is responsive to an approach of an object with conductivity. In this case, the touch screen (touch sensor) may also be categorized as a proximity sensor.

On the other hand, for the sake of brief explanation, a behavior in which the pointer is positioned to be proximate onto the touch screen without contact will be referred to as "proximity touch," whereas a behavior in which the pointer substantially comes into contact with the touch screen will be referred to as "contact touch." For the position corresponding to the proximity touch of the pointer on the touch screen, such position will correspond to a position where the pointer faces perpendicular to the touch screen upon the proximity touch of the pointer. The proximity sensor 141 may sense proximity touch, and proximity touch patterns (e.g., distance, direction, speed, time, position, moving state, etc.). On the other hand, the controller 180 may process data (or information) corresponding to the proximity touches and the proximity touch patterns sensed by the proximity sensor 141, and output visual information corresponding to the process data on the touch screen. In addition, the controller 180 may control the mobile terminal 100 to execute different operations or process different data (or information) according to whether a touch with respect to the same point on the touch screen is either a proximity touch or a contact touch.

A touch sensor can sense a touch applied to the touch screen, such as display 151, using any of a variety of touch methods. Examples of such touch methods include a resistive type, a capacitive type, an infrared type, and a magnetic field type, among others.

As one example, the touch sensor may be configured to convert changes of pressure applied to a specific part of the display unit 151 or a capacitance occurring from a specific part of the display unit 151, into electric input signals. The touch sensor may be configured to detect a position, an area where a touch object applying a touch onto the touch screen is touched on the touch sensor, a pressure at the time of touch, a capacitance at the time of touch, and the like. Here, the touch object body may be a finger, a touch pen or stylus pen, a pointer, or the like as an object through which a touch is applied to the touch sensor.

When a touch input is sensed by a touch sensor, corresponding signals may be transmitted to a touch controller. The touch controller may process the received signals, and then transmit corresponding data to the controller 180. Accordingly, the controller 180 may sense which region of the display 151 has been touched. Here, the touch controller may be a component separate from the controller 180 or the controller 180 itself.

On the other hand, the controller 180 may execute a different control or the same control according to a type of an object which touches the touch screen (or a touch key provided in addition to the touch screen). Whether to execute the different control or the same control according to the object which gives a touch input may be decided based on a current operating state of the mobile terminal 100 or a currently executed application program.

Meanwhile, the touch sensor and the proximity sensor may be executed individually or in combination, to sense various types of touches, such as a short (or tap) touch, a long touch, a multi-touch, a drag touch, a flick touch, a pinch-in touch, a pinch-out touch, a swipe touch, a hovering touch, and the like.

An ultrasonic sensor may be configured to recognize position information relating to a sensing object by using ultrasonic waves. On the other hands, the controller 180 may calculate a position of a wave generation source based on information sensed by an illumination sensor and a plurality of ultrasonic sensors. Since light is much faster than ultrasonic waves, a time for which the light reaches the optical sensor may be much shorter than a time for which the ultrasonic wave reaches the ultrasonic sensor. The position of the wave generation source may be calculated using the fact. In more detail, the position of the wave generation source may be calculated by using a time difference from the time that the ultrasonic wave reaches based on the light as a reference signal.

The camera 121 constructing the input unit 120 may be a type of camera sensor. The camera sensor may include at least one of a photo sensor (or image sensor) and a laser sensor.

Implementing the camera 121 with a laser sensor may allow detection of a touch of a physical object with respect to a 3D stereoscopic image. The photo sensor may be laminated on the display device. The photo sensor may be configured to scan a movement of the sensing object in proximity to the touch screen. In more detail, the photo sensor may include photo diodes and transistors at rows and columns to scan content placed on the photo sensor by using an electrical signal which changes according to the quantity of applied light. Namely, the photo sensor may calculate the coordinates of the sensing object according to variation of light to thus obtain position information of the sensing object.

The display 151 may display (output) information processed in the mobile terminal 100. For example, the display 151 may display execution screen information of an application program driven in the mobile terminal 100 or user interface (UI) and graphic user interface (GUI) information in response to the execution screen information.

Furthermore, the display 151 may be implemented as a stereoscopic display for displaying stereoscopic images.

The stereoscopic display may employ a stereoscopic display scheme such as stereoscopic scheme (a glass scheme), an auto-stereoscopic scheme (glassless scheme), a projection scheme (holographic scheme), or the like.

The audio output unit 152 may output audio data received from the wireless communication unit 110 or stored in the memory 160 in a call signal reception mode, a call mode, a record mode, a voice recognition mode, a broadcast reception mode, and the like. Also, the audio output module 152 may also provide audible output signals associated with a particular function (e.g., a call signal reception sound, a message reception sound, etc.) carried out by the mobile terminal 100. The audio output module 152 may include a receiver, a speaker, a buzzer or the like.

A haptic module 153 may generate various tactile effects the that user may feel. A typical example of the tactile effect generated by the haptic module 153 may be vibration. Strength, pattern and the like of the vibration generated by the haptic module 153 may be controllable by a user selection or setting of the controller 180. For example, the haptic module 153 may output different vibrations in a combining manner or a sequential manner.

Besides vibration, the haptic module 153 may generate various other tactile effects, including an effect by stimulation such as a pin arrangement vertically moving with respect to a contact skin, a spray force or suction force of air through a jet orifice or a suction opening, a touch on the skin, a contact of an electrode, electrostatic force, etc., an effect by reproducing the sense of cold and warmth using an element that can absorb or generate heat, and the like.

The haptic module 153 may be configured to transmit tactile effects through a user's direct contact, or a user's muscular sense using a finger or a hand. Two or more haptic modules 153 may be provided according to the particular configuration of the mobile terminal 100.

An optical output module 154 may output a signal for indicating an event generation using light of a light source. Examples of events generated in the mobile terminal 100 may include a message reception, a call signal reception, a missed call, an alarm, a schedule notice, an email reception, an information reception through an application, and the like.

A signal output by the optical output module 154 may be implemented in such a manner that the mobile terminal emits monochromatic light or light with a plurality of colors. The signal output may be terminated as the mobile terminal senses that a user has checked the generated event, for example.

The interface unit 160 serves as an interface for external devices to be connected with the mobile terminal 100. For example, the interface unit 160 can receive data transmitted from an external device, receive power to transfer to elements and components within the mobile terminal 100, or transmit internal data of the mobile terminal 100 to such external device. The interface unit 160 may include wired or wireless headset ports, external power supply ports, wired or wireless data ports, memory card ports, ports for connecting a device having an identification module, audio input/output (I/O) ports, video I/O ports, earphone ports, or the like.

The identification module may be a chip that stores various information for authenticating authority of using the mobile terminal 100 and may include a user identity module (UIM), a subscriber identity module (SIM), a universal subscriber identity module (USIM), and the like. In addition, a device having the identification module (hereinafter, an "identification device") may be fabricated in the form of a smart card. Accordingly, the identifying device may be connected with the electronic device 100 via the interface unit 160.

Furthermore, when the mobile terminal 100 is connected with an external cradle, the interface unit 160 may serve as a passage to allow power from the cradle to be supplied to the mobile terminal 100 therethrough or may serve as a passage to allow various command signals input by the user from the cradle to be transferred to the mobile terminal therethrough. Such various command signals received from the cradle or the power may operate as signals for recognizing that the mobile terminal 100 has accurately been mounted to the cradle.

The memory 170 can store programs to support operations of the controller 180 and store input/output data (for example, phonebook, messages, still images, videos, etc.). The memory 170 may store data associated with various patterns of vibrations and audio which are output in response to touch inputs on the touch screen.

The memory 170 may include at least one type of storage medium including a Flash memory, a hard disk, a multimedia card micro type, a card-type memory (e.g., SD or DX memory, etc.), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, and an optical disk. Also, the mobile terminal 100 may be operated in relation to a web storage device that performs the storage function of the memory 170 over the Internet.

As aforementioned, the controller 180 may typically control the general operations of the mobile terminal 100. For example, the controller 180 may set or release a locked state for restricting a user from inputting a control command with respect to applications when a state of the mobile terminal meets a preset condition.

Furthermore, the controller 180 may also perform controlling and processing associated with voice calls, data communications, video calls, and the like, or perform pattern recognition processing to recognize a handwriting input or a picture drawing input performed on the touch screen as characters or images, respectively. In addition, the controller 180 may control one or combination of those components in order to implement various exemplary embodiment disclosed herein on the mobile terminal 100.

The power supply unit 190 may receive external power or internal power and supply appropriate power required for operating respective elements and components included in the electronic device 100 under the control of the controller 180. The power supply unit 190 may include a battery, which is typically rechargeable or be detachably coupled to the terminal body for charging.

Furthermore, the power supply unit 190 may include a connection port. The connection port may be configured as one example of the interface unit 160 to which an external (re)charger for supplying power to recharge the battery is electrically connected.

As another example, the power supply unit 190 may be configured to recharge the battery in a wireless manner without use of the connection port. Here, the power supply unit 190 may receive power, transferred from an external wireless power transmitter, using at least one of an inductive coupling method which is based on magnetic induction or a magnetic resonance coupling method which is based on electromagnetic resonance.

Various embodiments described herein may be implemented in a computer-readable or its similar medium using, for example, software, hardware, or any combination thereof.

The display 151 may display (output) information processed in the mobile terminal 100. For example, the display 151 may display execution screen information of an application program driven in the mobile terminal 100 or user interface (UI) and graphic user interface (GUI) information in response to the execution screen information.

The display 151 may include at least one of a liquid crystal display (LCD), a thin film transistor-liquid crystal display (TFT-LCD), an organic light emitting diode (OLED), a flexible display, a 3-dimensional (3D) display, and an e-ink display.

The display 151 may be implemented in two or more in number according to a configured aspect of the mobile terminal 100. For instance, a plurality of the displays 151 may be arranged on one surface to be spaced apart from or integrated with each other, or may be arranged on different surfaces.

The display 151 may include a touch sensor which senses a touch onto the display so as to receive a control command in a touching manner. When a touch is input to the display 151, the touch sensor may be configured to sense this touch and the controller 180 may generate a control command corresponding to the touch. The content which is input in the touching manner may be a text or numerical value, or a menu item which can be indicated or designated in various modes.

The microphone 122 may be formed to receive the user's voice, other sounds, and the like. The microphone 122 may be provided at a plurality of places, and configured to receive stereo sounds.

The interface unit 160 may serve as a path allowing the mobile terminal 100 to exchange data with external devices. For example, the interface unit 160 may be at least one of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

At least one antenna for wireless communication may be disposed on the terminal body. The antenna may be integrated into the terminal body or disposed in the case. For example, an antenna which configures a part of the broadcast receiving module 111 (see FIG. 1A) may be retractable into the terminal body. Otherwise, the antenna may be disposed in a film type and adhered to an inner surface of a housing, and a case containing a conductive material may be configured to function as an antenna.

A power supply unit 190 (refer to FIG. 1A) for supplying power to the mobile terminal 100 may be disposed on the terminal body. The power supply unit 190 may include a batter 191 which is mounted in the terminal body or detachably coupled to an outside of the terminal body.

The battery 191 may receive power via a power source cable connected to the interface unit 160. Furthermore, the battery 191 may be (re)chargeable in a wireless manner using a wireless charger. The wireless charging may be implemented by magnetic induction or electromagnetic resonance.

An accessory for protecting an appearance or assisting or extending the functions of the mobile terminal 100 can also be provided on the mobile terminal 100. As one example of an accessory, a cover or pouch for covering or accommodating at least one surface of the mobile terminal 100 may be provided. The cover or pouch may link with the display 151 to extend the function of the mobile terminal 100. Another example of the accessory may be a touch pen for assisting or extending a touch input onto a touch screen.

Figure 1B:
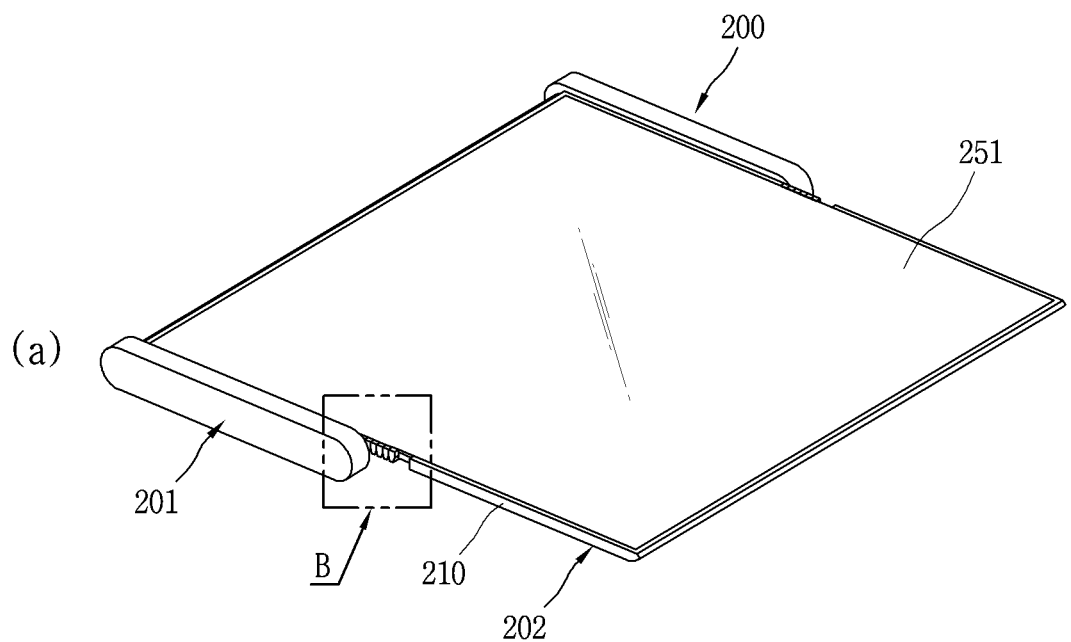
FIG. 1B is a conceptual view for explaining a flexible display device having an outer folding type flexible display device.
Figure 1B:
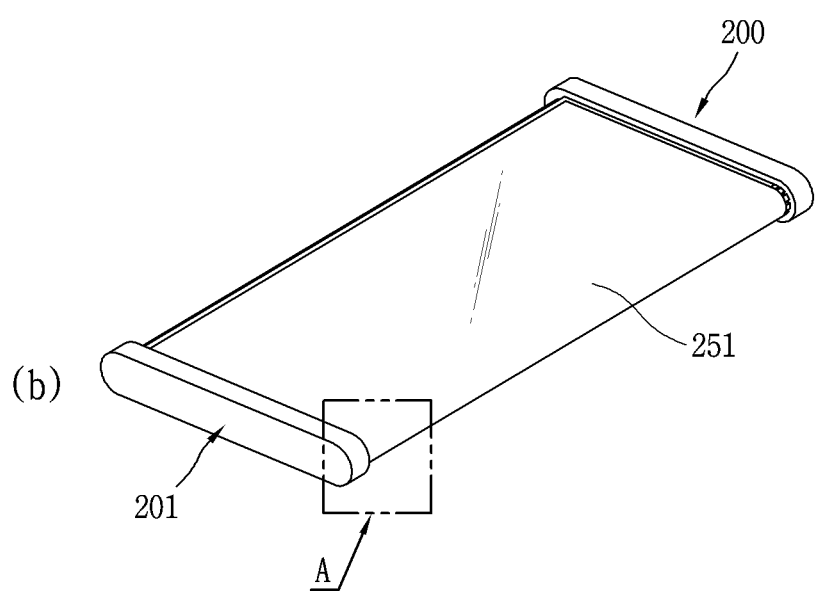
Figure 2:
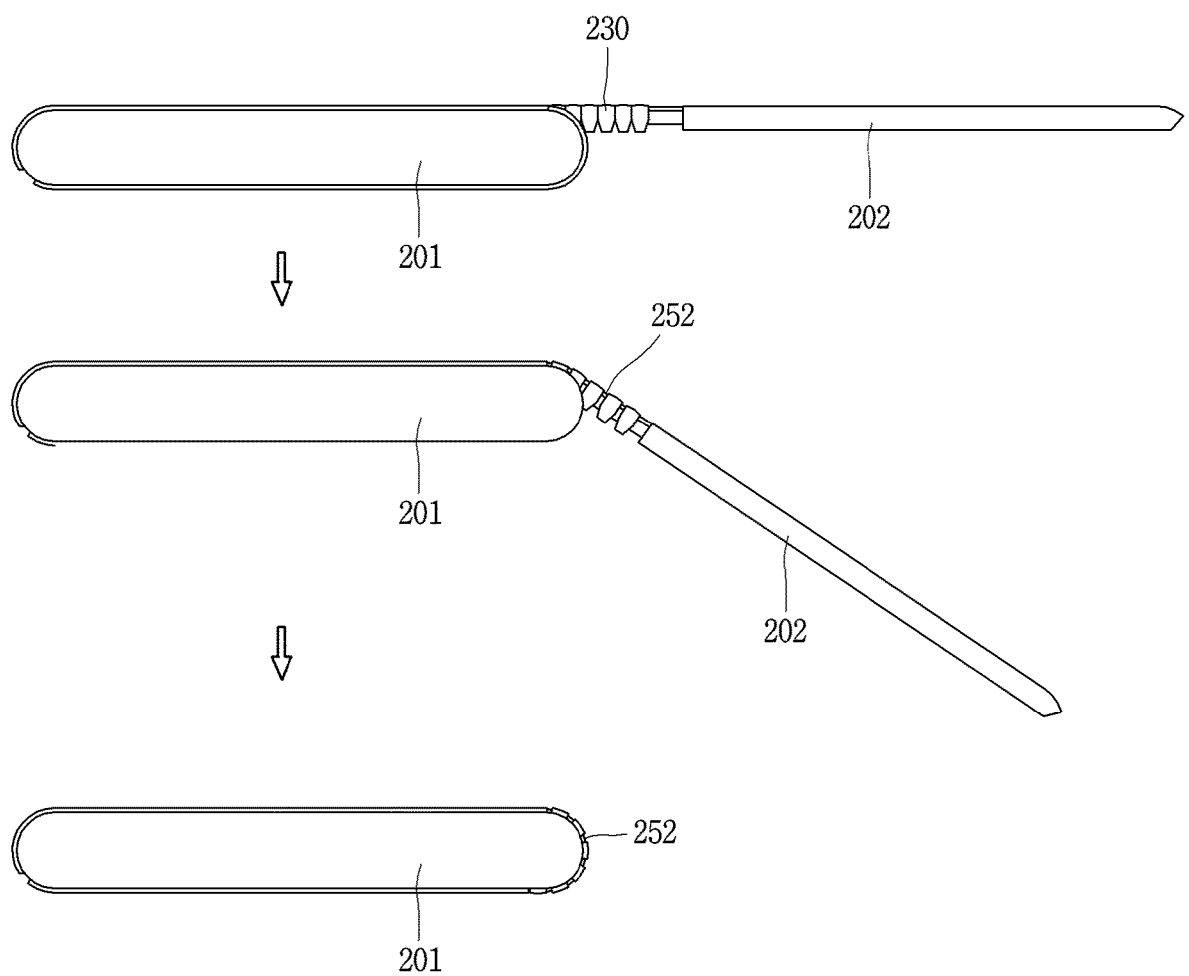
FIG. 2 is an operation diagram showing an operation of the flexible display device in FIG. 1B.

FIG. 1B is a conceptual view for explaining an outer folding type flexible display device as a flexible display device, and FIG. 2 is an operation diagram showing an operation of the flexible display device in FIG. 1B.

A mobile terminal 200 according to the present disclosure includes a flexible display 251 that is deformable by an external force.

The deformation may be at least one of curving, bending, folding, twisting and rolling of a display module. The deformable display module may be referred to as a "flexible display." Here, the flexible display 151 may include both a general flexible display and an e-paper.

The general flexible display denotes a light, non-fragile display, which still exhibits characteristics of the conventional flat panel display and is fabricated on a flexible substrate which can be curved, bent, folded, twisted or rolled.

Furthermore, the e-paper is a display technology employing the characteristic of a general ink, and is different from the conventional flat panel display in view of using reflected light. The e-paper may change information by using a twist ball or an electrophoresis using a capsule.

When in a configuration in which the flexible display 251 is not deformed (for example, in a configuration with an infinite radius of curvature and, hereinafter, referred to as a first configuration, refer to (a) in FIG. 1B), a display region of the flexible display 251 becomes a flat surface. In a configuration in which the display unit is deformed from the first configuration by an external force (for example, a configuration with a finite radius of curvature, hereinafter, referred to as a second configuration, refer to (b) in FIG. 1B), the display region may become a curved surface.

As illustrated in the drawing, information displayed in the second configuration may include visual information output on the curved surface. The visual information may be realized in such a manner that a light emission of each unit pixel (sub-pixel) arranged in a matrix configuration is controlled independently. The unit pixel denotes an elementary unit for representing one color.

The flexible display 251 may be placed in a curved state (for example, a state of being curved from up to down or from right to left), other than a flat state, in the first configuration. In this case, when an external force is applied to the flexible display 251, the flexible display 251 may be deformed back into a flat state (or less curved state) or into a more curved state.

On the other hand, the flexible display 151 may implement a flexible touch screen using a touch sensor in combination with a touch sensor. When a touch is input onto the flexible touch screen, the controller 180 (see FIG. 1A) may execute a control corresponding to the touch input. The flexible touch screen may be configured to sense a touch input even in the second configuration as well as in the first configuration.

On the other hand, the mobile terminal 200 according to the modified example may include a deformation sensor which senses the deformation of the flexible display 251. The deformation sensor may be included in the sensing unit 140 (see FIG. 1A).

The deformation sensor may be provided in the flexible display 251 or bodies 201, 202 to sense information related to the deformation of the flexible display 251. Here, the information related to the deformation of the flexible display 251 may be a deformed direction, a deformed degree, a deformed position, a deformed time, an acceleration that the deformed flexible display 251 is restored, and the like. In addition to those, such information may be various information which is sensible in response to curving of the flexible display 251.

Furthermore, the controller 180 (refer to FIG. 1A) may change information displayed on the flexible display 251 or generate a control signal for controlling a function of the mobile terminal 200, based on the information related to the deformation of the flexible display 251 sensed by the deformation sensor.

The configuration deformation of the display 251 may not be necessarily limited to an external force. For example, when the flexible display 251 is in a first configuration, it may be deformed to a second configuration by a command of a user or application.

The mobile terminal 200 according to an embodiment of the present disclosure may include a housing 210 configured to be foldable and unfoldable. The housing 210 may be a case (e.g., a frame, a cover, or the like) that forms an appearance of the mobile terminal. The housing 210 has a plurality of cases, and various electronic parts are arranged in an inner space defined by their coupling.

According to the illustration, the housing 210 may be provided in first and second bodies 201, 202, respectively, which are rotatably connected to each other. The flexible display 251 is coupled to one surface of the housing 210, and disposed to be deformable.

In this case, the flexible display 251 is configured to cover an upper surface of the first body 201 together with the second body 201, and a rear surface of the first body 201 is superimposed with the second body 202 such that the flexible display 251 is exposed to the outside in the second configuration in which the flexible display 251 is folded.

More specifically, the first body 201 supports one region of the flexible display 251 and the second body 202 supports the other region (remaining region) of the flexible display 251. A plurality of electronic parts for driving the mobile terminal 200 are mounted on at least one region of the first and second bodies 201, 202.

The first and second bodies 201, 202 rotate relative to each other with an angle while being connected to each other, and through this, the flexible display unit 251 is bent, and thus the flexible display unit 251 becomes a folding state (folded state, second configuration) in which at least one region thereof is folded in an overlapping manner.

A drawing (a) of FIG. 1B is a conceptual view illustrating unfolding (an unfolded state, a first configuration) in which the flexible display 251 is in an unfolded state, and a drawing (b) of FIG. 1B is a conceptual view illustrating folding (a second configuration) in which the flexible display 251 is in a folded state. The rear surfaces of the first and second bodies 201 and 202 face each other by the folding, and in this case, the flexible display 251 is disposed at an outside of the bodies to maintain a state that an outer surface of the flexible display 251 is exposed. Therefore, the mobile terminal of the present example may be an outer folding type flexible display device. According to such an outer folding structure, the flexible display 251 is configured to be exposed to the outside when folded and to cover an outer surface of the first body 201 together with the second body 202.

In this case, a part of the screen of the flexible display 251 in which another part thereof is disposed on one surface of the first body 201 may be disposed on the other surface of the first body 201 in a second configuration. To this end, the second body 202 may be accommodated on the other surface of the first body 201 in the second configuration. For example, a receiving groove 201a (see FIGS. 3 and 4) may be disposed on the other surface of the second body 202, and the first body 201 may be accommodated in the receiving groove 201a in the second configuration.

Figure 3:
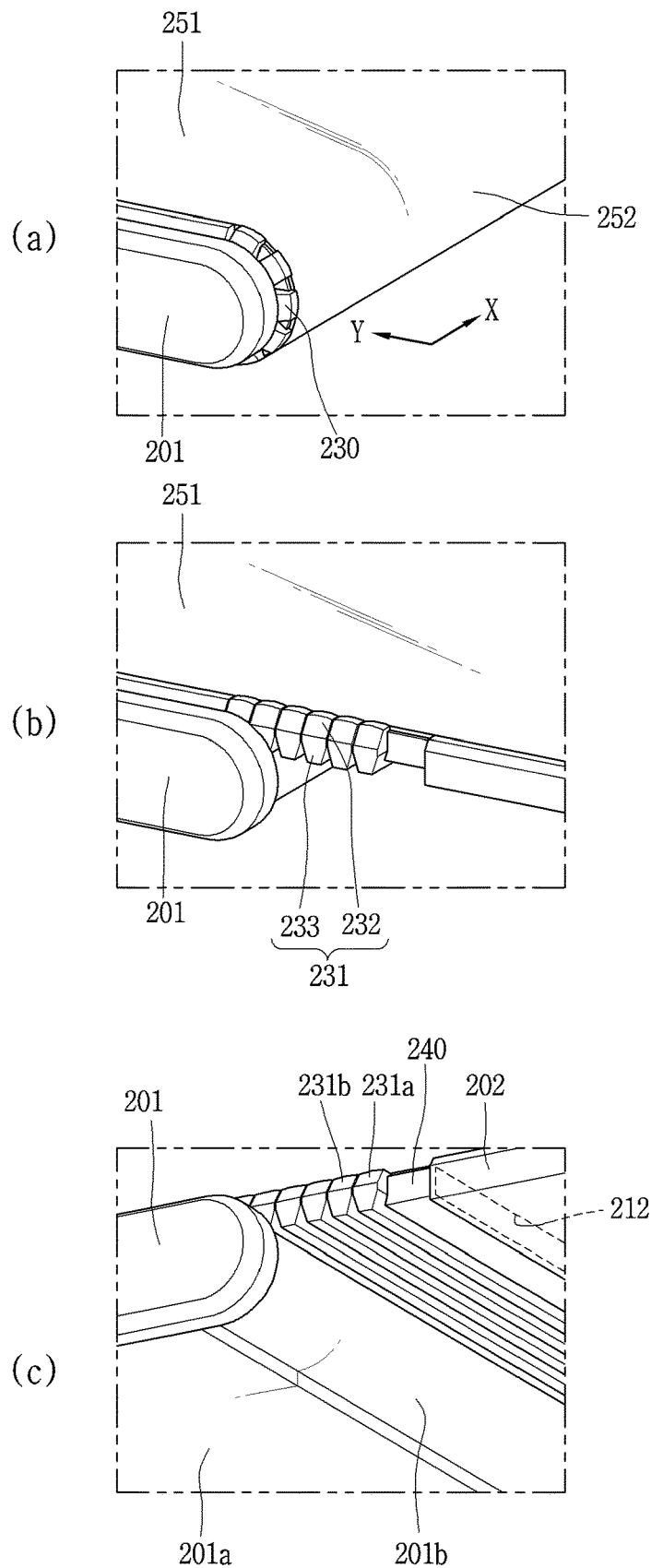
FIG. 3 is an enlarged view showing portions "A" and "B" in FIG. 1B.
Figure 4:
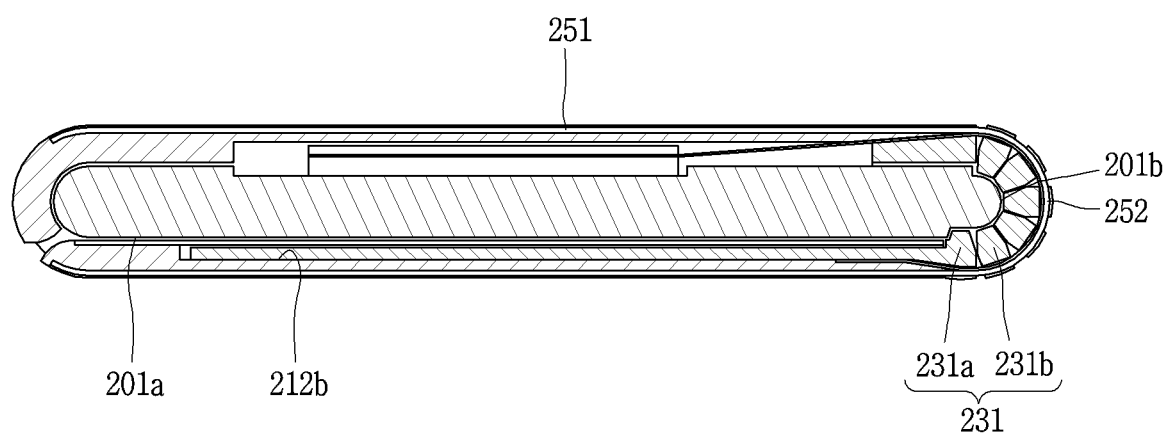
FIG. 4 is a cross-sectional view showing an operation of the flexible display device in FIG. 1B.

In this case, the receiving groove 201a may extend to one side surface of the first body to define a side receiving groove 201b (see FIGS. 3 and 4). A hinge portion 230 which will be described later in the second configuration may be accommodated in the side receiving groove 201b.

On the other hand, referring to FIG. 2, there also exists a configuration in which an angle defined by one region of the flexible display 251 and the remaining region thereof is varied while being deformed from the first configuration to the second configuration. In response to the variable angle, the flexible display 251 is gradually folded to switch from a first configuration to a second configuration.

In the second configuration, the first and second bodies 201, 202 are overlapped with each other, and a space between the one region and the other region of the flexible display 251 is bent while defining a curved surface. In this case, a portion forming the curved surface may be a bent portion 252 (refer to FIG. 3). In other words, the flexible display 251 may be configured with a bent portion 252 that is bent by the folding of the housing 210, and the bent portion 252 of the flexible display 251 may be configured to surround one side surface of the first body 201 when folded. According to the illustration, one side surface of the first body 201 may have a thickness greater than that of the second body 202, and the one side surface is surrounded by the first body 201 together with the flexible display 251 to implement outer folding.

In this case, a length change occurs as the flexible display 251 moves away from the neutral line (NL) having no length change when the flexible display 251 is folded and unfolded. In the present disclosure, though the neutral line of the hinge portion is located at a position spaced apart from the display line, a compensation mechanism implemented by an outer folding type flexible display device is proposed. In addition, in the present example, the length compensation is automatically carried out in conjunction with folding and unfolding of the flexible display 251, and hereinafter, such a compensation mechanism will be described in more detail with reference to the accompanying drawings.

Figure 5:
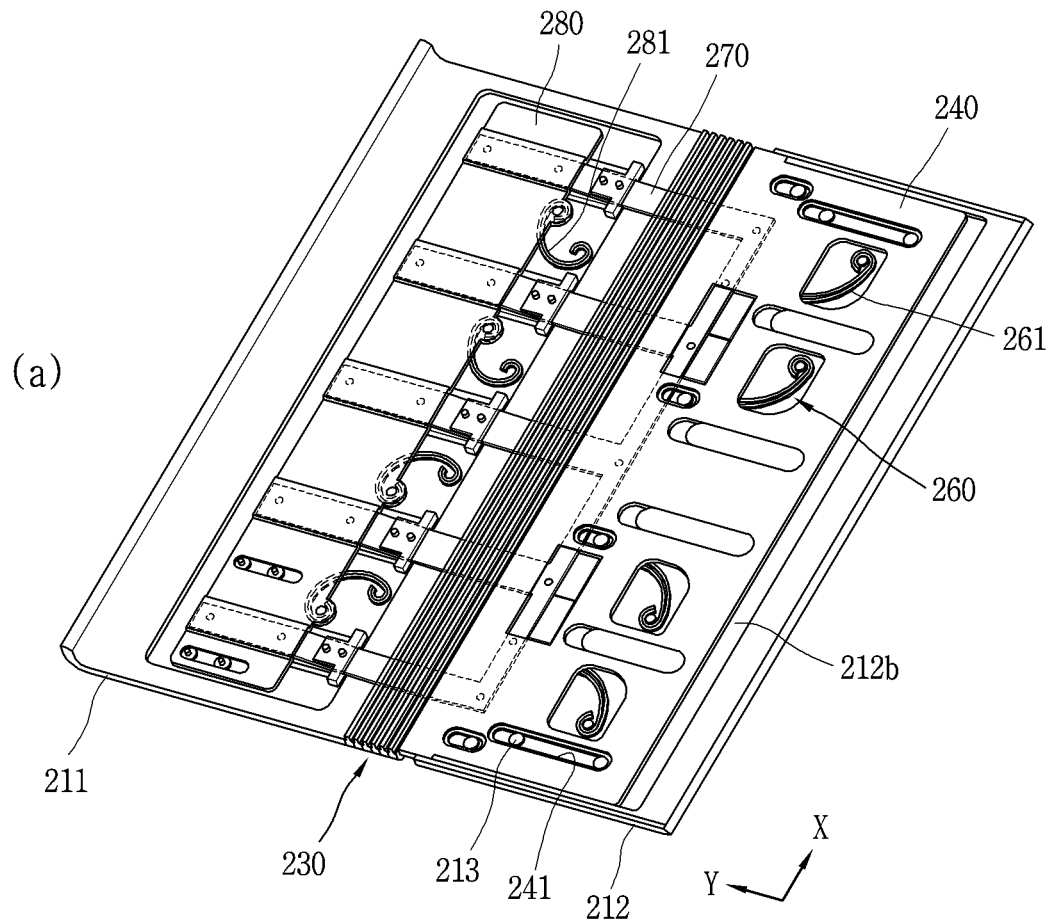
FIG. 5 is an exploded view of the flexible display device in FIG. 1B and an enlarged view of an actuator.
Figure 5:
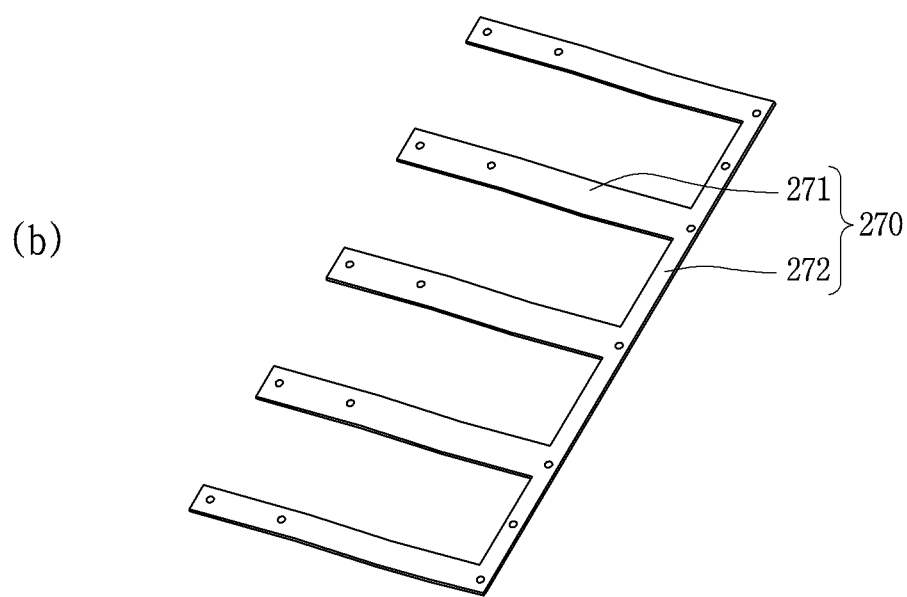

FIG. 3 is an enlarged view showing portions "A" and "B" in FIG. 1B, and FIG. 4 is a cross-sectional view showing an operation of the flexible display device in FIG. 1B, and (a) of FIG. 5 is an exploded view of the flexible display device in FIG. 1B, and (b) of FIG. 5 is an enlarged view of an actuator. In this case, (c) of FIG. 3 is an enlarged view in which portion "B" in FIG. 1B is viewed from below.

Referring to the present drawings, the first and second bodies 201, 202 may be rotatably connected to each other by the hinge portion 230. In other words, the hinge portion 230 connects the first and second bodies 201, 202 in a relatively rotatable manner and is disposed between the first and second bodies 201, 202. The flexible display unit 251 is disposed on one surface of the first and second bodies 201, 202, and folded and unfolded by the relative rotation.

According to the drawing, at least part of the hinge portion 230 is varied in length, and the housing of the second body 202 is configured to relatively slide with respect to the hinge portion 230 to compensate for the length variation of the hinge portion 230 during the folding.

In this case, folding is carried out while the hinge portion 230 surrounds one side surface of the second body fixed with respect to the hinge portion 230. For a more specific example, one side surface of the first body 201 has a thickness greater than that of the second body 202, and the hinge portion 230 is defined to surround one side surface of the first body 201 when folded.

According to the illustration, the hinge portion 230 includes a plurality of hinge segments 231 sequentially arranged along one direction, and the hinge segments 231 may be arranged to surround one side surface of the first body 201 during the folding. For example, at least part of one side surface of the first body 201 may be defined on a curved surface, and the hinge segments 231 of the hinge portion 230 may be sequentially arranged along the curved surface of the first body 201 in a second configuration in which the flexible display 251 covers the first body 201. In this case, the curved surface may be the bottom of the side receiving groove 201b as described above.

More specifically, the plurality of hinge segments 231 may be rotatably connected to an adjacent hinge segment to have a bendable shape, and may be arranged between the first and second bodies 201, 202.

The hinge segments 231 may be sequentially arranged along an edge of the mobile terminal 200, and coupled to a hinge segment adjacent thereto at the rotation center so that a gap of at least part thereof is changed by folding and unfolding the flexible display 251. For example, both ends of the hinge segments 231 may be disposed to allow rotational displacement as free ends, and a rotary shaft disposed between the both ends may define a center of the rotational displacement.

The hinge segments 231 may be arranged in an area corresponding to the bent portion 252. More specifically, since the hinge segments 231 guide the folding and unfolding of the bent portion 252, a bent cross-sectional shape of the bent portion 252 may overlap with the hinge segments 231. have. In this case, the hinge segments 231 may be elongated along the X-direction (a width direction of the mobile terminal), and may be disposed to face a rear surface of the flexible display 251.

Referring to the drawings, the hinge segments 231 are arranged such that a distance between one end portions close to the flexible display 251 varies according to the folding and unfolding.

For example, as the hinge segments 231 are switched from the unfolding to the folding, a distance between one end portions of the hinge segments 231 increases with respect to the rotational center of the hinge segments 231, and the flexible display 251 is disposed to cover the one end portion. In other words, a distance between one end portions 232 at the upper side increases, and a distance between the other end portions 233 at the lower side decreases with respect to the rotational center during folding.

In this case, the first and second bodies 201, 202 may be arranged to relatively slide to compensate for the distance variation. More specifically, the present example includes a body (second body) that relatively slides with respect to the hinge portion 230 and a body (first body) fixed to the hinge portion 230.

In order to implement the sliding operation, the flexible display 251 is fixed to a housing 212 of the second body 202, and a sliding plate 240 slidably connected to the housing 212 of the second body 202 extends from the hinge portion 230. Through this, a variation in the length of the hinge 230 may be compensated.

More specifically, the sliding plate 240 is slidably inserted into the housing 212 of the second body 202, and the sliding plate 240 may be connected to any one of the hinge segments 231. For example, the outermost first hinge segment 231a of the hinge segments may be integrally formed with the sliding plate 240.

In this case, an Mth hinge segment disposed at the position (opposite outermost side) farthest from the first hinge segment 231a may be rotatably connected to the first body 201 at one side, and an M−1th hinge segment may be rotatably connected to the first body 201 at the other side.

On the contrary, the first hinge segment 231a may be rotatably connected to a second hinge segment 231b adjacent to one side thereof, and the sliding plate 240 may protrude toward the second body 202 at the other side the first hinge segment 231a. An opening 212a into which the sliding plate 240 is inserted may be disposed in the housing 212 of the second body, and as the first hinge segment 231a is in contact with an outer wall of the opening 212a, the sliding may be restricted in a direction in which the opening 212a and the first hinge segment 231a are closer to each other. In addition, a seating groove 212b in which the sliding plate 240 is seated is disposed on one surface of the housing 212 of the second body, and an inner wall of the seating groove 212b guides the sliding of the sliding plate 240.

A plurality of guide protrusions 213 protrude from the seating groove 212b, and a plurality of guide holes 241 into which the guide protrusions 213 are inserted may be arranged on the sliding plate 240. The guide hole 241 is elongated along the Y-direction, and the guide protrusion 213 is disposed to move along the guide hole 241 by a slidable distance of the sliding plate 240.

In the present example, an elastic force providing unit 260 is provided to automatically perform the length compensation through sliding. For example, the elastic force providing unit 260 may add an elastic force to the sliding plate 240, and may be disposed in the housing 212 of the second body 202.

The elastic force providing unit 260 may add an elastic force to the sliding plate 240 in a direction away from the hinge 230. For such an example, the elastic force providing unit 260 may be provided with springs 261, one end of which is connected to the sliding plate 240 and the other end of which is connected to the housing 212 of the second body 202. For example, the springs 261 may be arranged between a rear surface of the sliding plate 240 and a bottom of the seating groove 212b, and may be defined in a bow-shaped curve and connected to a rear surface of the sliding plate 240 and the seating groove 212b, respectively. In addition, the springs 261 may be arranged between the plurality of guide holes 241 to apply a uniform elastic force to the overall sliding plate 240.

Through this, the spring 261 adds the maximum elastic force in the Y-direction (a length direction of the mobile terminal) when the housing 212 of the hinge portion 230 and the second body 202 are maximally separated from each other. In addition, when the hinge portion 230 and the housing 212 of the second body 202 are maximally close to each other by folding, an elastic force in the Y-direction may be reduced.

According to the above-described structure, when a distance between the hinge segments 231 is varied by folding, the housing 212 of the second body 202 must slide toward the hinge portion 230 while overcoming the elastic force in the Y-direction. Therefore, the sliding operation may be smoothly carried out.

In addition, a distance between the hinge portion 230 and the housing 212 of the second body 202 must be maintained when unfolded. To this end, an actuator 270 is connected to the sliding plate 240 and at least part of the first body, respectively, to pull the sliding plate 240 toward the hinge portion 230. The actuator 270 may be a superelastic wire, a Flexinol muscle wire, a shape-memory alloy wire, or the like.

According to the illustration, the actuator 270 may include an extension portion 271 and a connection portion 272.

The extension portion 271 is disposed to extend from the first body to the sliding plate 240 through the hinge portion 230. A plurality of the extension portions 271 may be provided along the Y-direction, and may be sequentially arranged along the X-direction. The connection portion 272 is disposed in a direction perpendicular to the extension portions 271 to connect the extension portions 271 with each other.

More specifically, one ends of the extension portions 271 may be coupled to the first body, and the other ends thereof may be connected to each other at the connection portion 272. In this case, the connecting portion 272 may be coupled to the sliding plate 240. For example, the connection portion 272 is connected to the sliding plate 240 to pull the sliding plate 240 toward the first body 201.

In this case, the actuator 270 may be connected to a support plate 280 provided in the first body 201. The support plate 280 may be slidably coupled to the housing 211 of the first body 201, and a spring 281 that applies an elastic force to the support plate 280 may be disposed in the housing 211 of the first body 201.

The support plate 280 may be slidably coupled to the housing 211 of the first body 201. One end of the spring 281 may be connected to the housing 211 of the first body 201, and the other end of the spring 281 may be connected to the support plate 280, thereby adding an elastic force to the support plate 280 in a direction away from the second body 202. At this time, a Y-direction elastic force of a spring (hereinafter, a first spring 281) of the first body 201 is greater than that of a spring (hereinafter, a second spring 261) of the second body 202. Accordingly, the first body side is fixed, and relative sliding with respect to the hinge portion 230 may occur at the second body side.

According to the above-described structure, a mechanism in which relative sliding between the sliding plate 240 and the housing 212 is interlocked with the folding and unfolding operations of a display in an outer folding type flexible display device may be implemented through a length compensation structure.

On the other hand, the above-described structure may be modified in various forms, and those modified examples will be described in more detail below with reference to the drawings.

Figure 6:
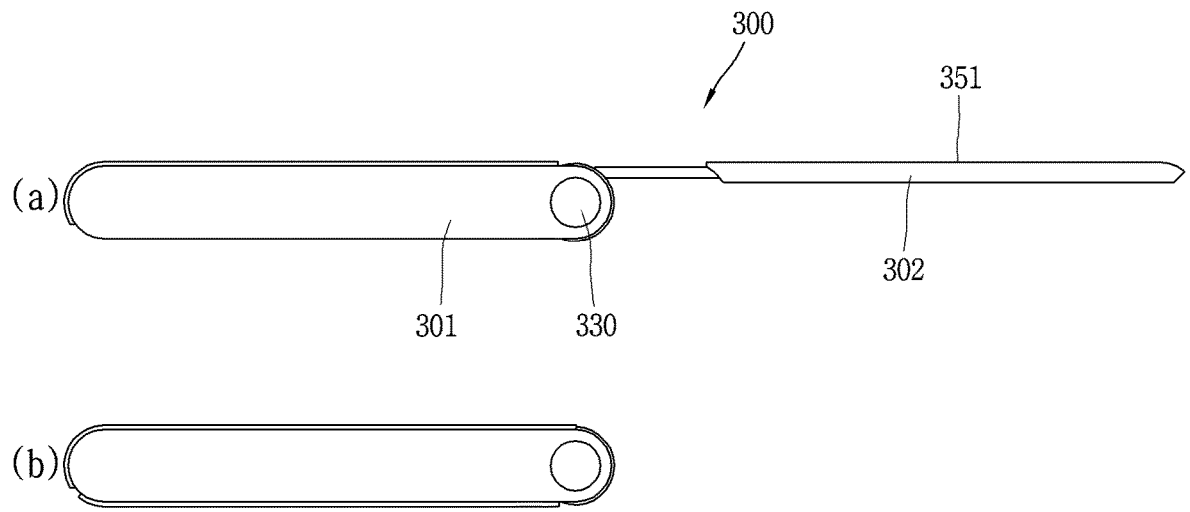
FIG. 6 is operation diagrams showing an operation of a flexible display device according to another embodiment of the present disclosure.
Figure 7:
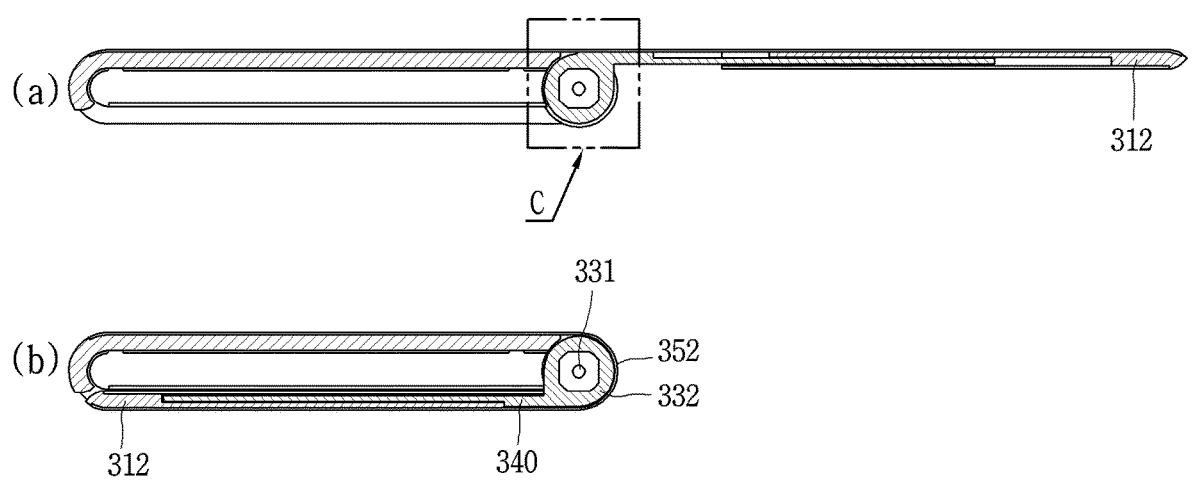
FIG. 7 is cross-sectional views showing an operation of the flexible display device in FIG. 6.
Figure 8:
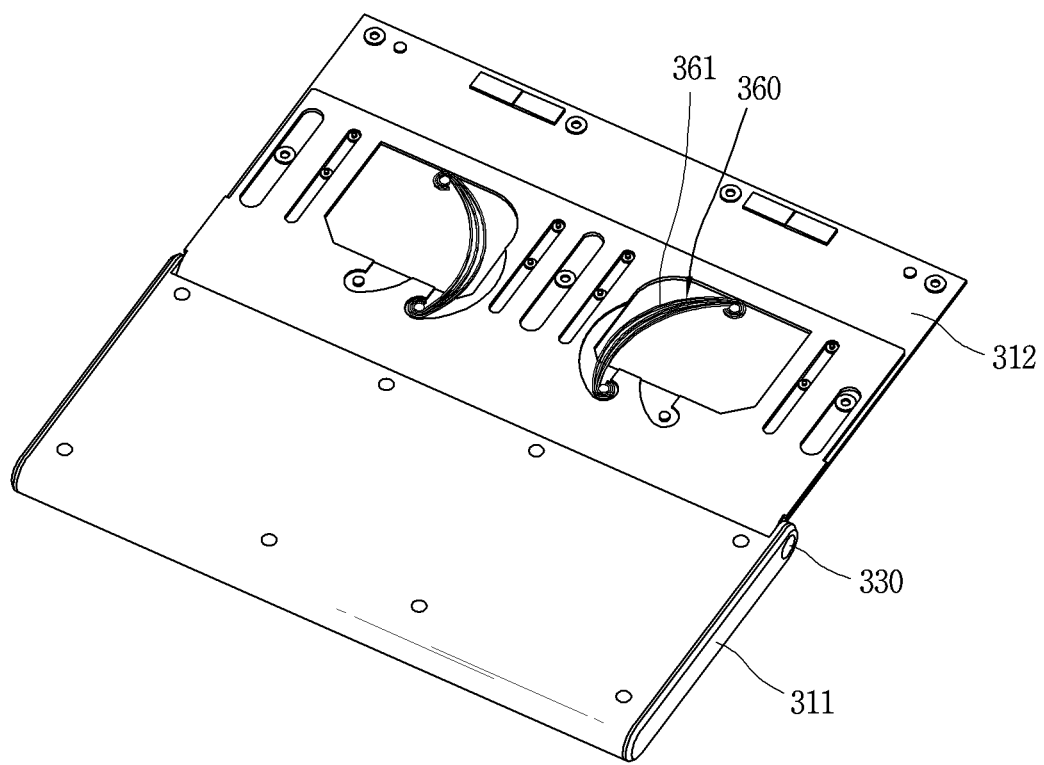
FIG. 8 is an exploded view showing the flexible display device in FIG. 6.
Figure 9:
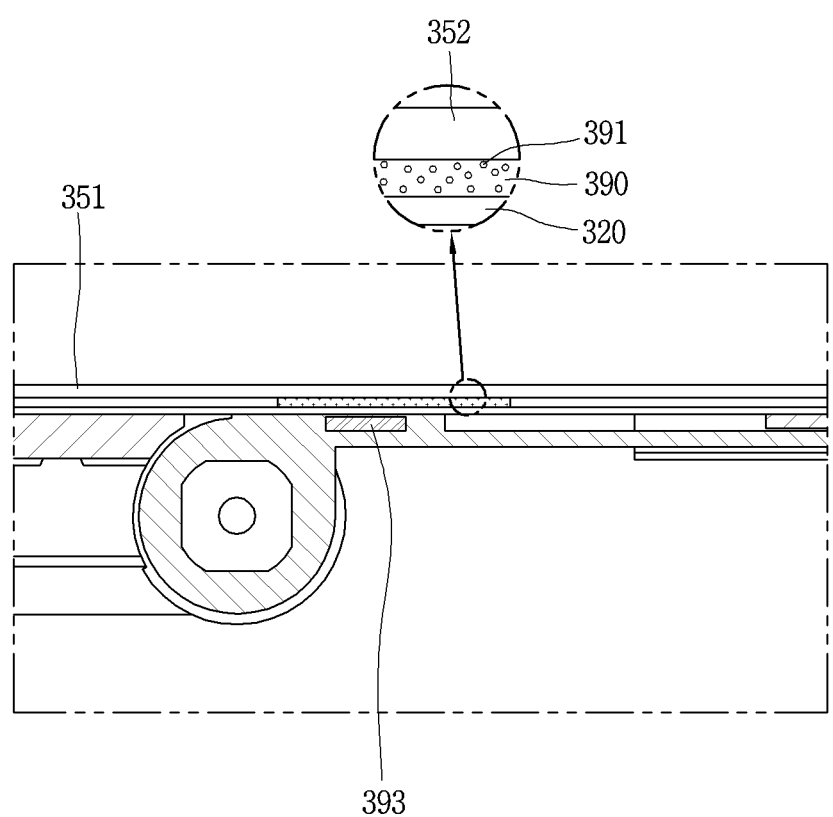
FIG. 9 is an enlarged view showing portion "C" in FIG. 7.
Figure 10:
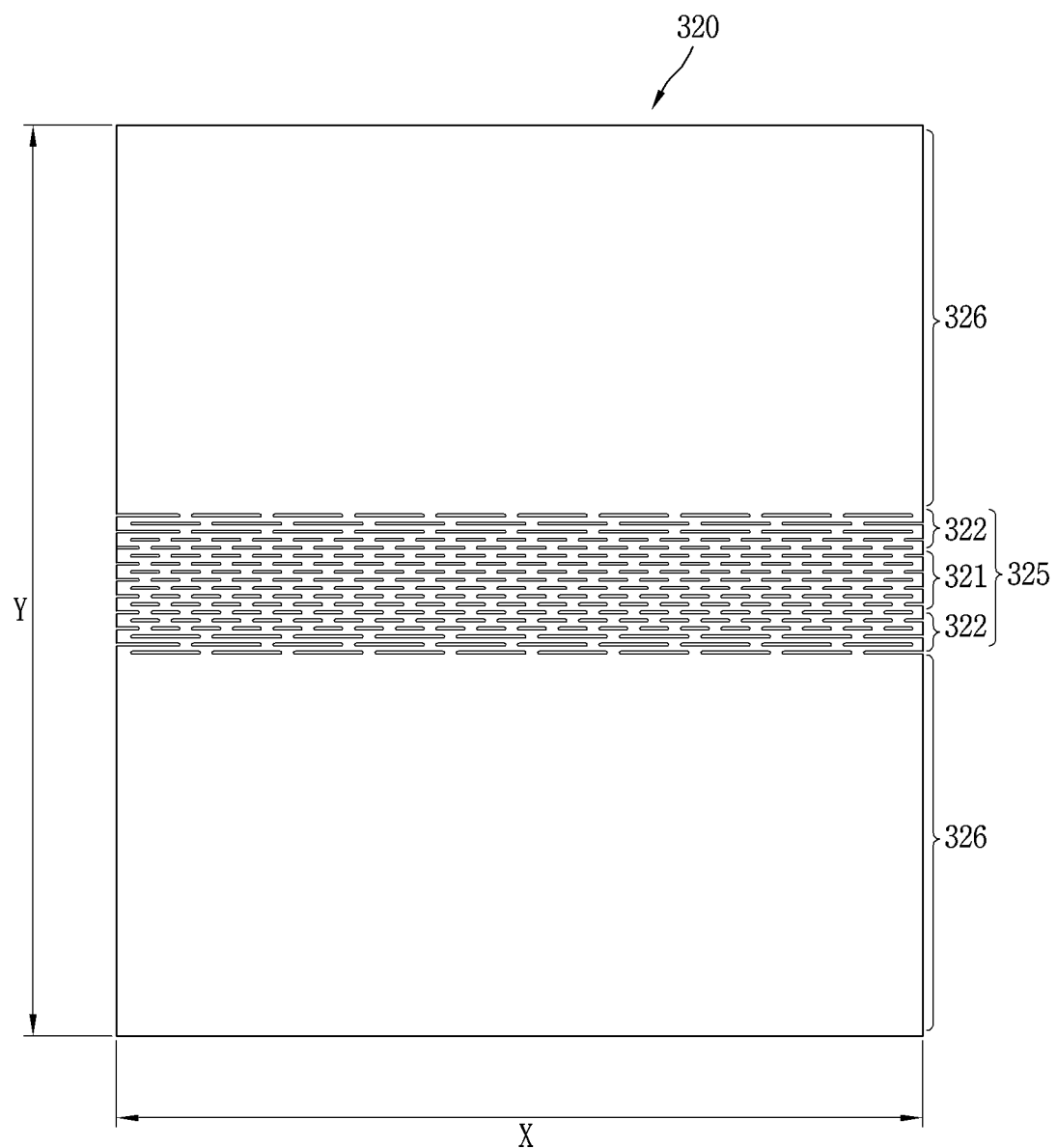
FIG. 10 is a plan view showing a flexible frame in FIG. 9.

FIG. 6 is operation diagrams showing an operation of a flexible display device according to another embodiment of the present disclosure, and FIG. 7 is cross-sectional views showing an operation of the flexible display device in FIG. 6, and FIG. 8 is an exploded view showing the flexible display device in FIG. 6, and FIG. 9 is an enlarged view showing portion "C" in FIG. 7, and FIG. 10 is a plan view showing a flexible frame in FIG. 9.

Referring to the present drawings, the mobile terminal 300 may include a flexible display 351 configured to be deformable by an external force, and the flexible display 351 may be fixed to one surface of the first and second bodies 301, 302, and the first and second bodies 301, 302 may be rotatably connected to each other by a hinge portion 330.

Since the structures of the flexible display 351 and the first and second bodies 301, 302 are the same as those of the embodiment described with reference to FIGS. 1B through 6, the description thereof will be replaced with the foregoing description. For such an example, the flexible display 351 may be deformed between a first configuration in an unfolded state and a second configuration that is folded by an external force.

In this case, the structure of the hinge portion may be a folder hinge type, unlike the joint type of the above-described example. However, the present disclosure may not be necessarily limited to this, and the joint type hinge portion may also be applicable to the present example.

The hinge portion 330 connects the first and second bodies 301, 302 in a relatively rotatable manner and is disposed between the first and second bodies 301, 302. The flexible display unit 351 is disposed on one surface of the first and second bodies 301, 302, and folded and unfolded by the relative rotation.

According to the illustration, the hinge portion 330 includes a hinge body 332 which rotates about a hinge shaft 331 disposed on one side surface of the first body 301. The hinge body 332 may be provided with a hinge hole into which the hinge shaft 331 is inserted. In addition, a sliding plate 340 may protrude from one side of the hinge body 332.

Referring to the present drawings, the hinge body 332 is moved by the sliding plate 340 in a direction closer to or away from the opening of the housing 312 of the second body 302 according to the folding and unfolding. Through this, the flexible display 351 may be fixed to the first and second bodies 301, 302 to compensate for a length variation occurring at a position spaced apart from the flexible display 351.

In other words, the first and second bodies 301, 302 may be configured to relatively slide to compensate for the length variation. More specifically, the present example includes a body (second body) that relatively slides with respect to the hinge portion 330 and a body (first body) fixed to the hinge portion 230.

In order to implement the sliding operation, the flexible display 351 is fixed to a housing 312 of the second body 302, and a sliding plate 340 slidably connected to the housing 312 of the second body 302 extends from the hinge body 332.

More specifically, the sliding plate 340 may be slidably inserted into the housing 312 of the second body 302, and an elastic force providing unit 360 may be provided in the housing to automatically perform the length compensation through sliding. For example, the elastic force providing unit 360 may add an elastic force to the sliding plate 340, and may be disposed in the housing 312 of the second body 302.

The elastic force providing unit 360 may add an elastic force to the sliding plate 340 in a direction away from the hinge 330. For such an example, the elastic force providing unit 360 may be provided with springs 361, one end of which is connected to the sliding plate 340 and the other end of which is connected to the housing 312 of the second body 302. For example, the springs 361 may be defined in a bow-shaped curve and connected to a rear surface of the sliding plate 240 and the housing 312, respectively.

According to the structure described above, the housing 312 of the second body 302 slides toward the hinge body 332 while overcoming the elastic force in the Y-direction by folding.

On the other hand, the flexible display 351 is provided with a bent portion 352 that is bent by the folding, and a flexible member 390 into which a magnetic material 391 is mixed may be disposed on a rear surface of the flexible display 351 to pressurize the bent portion 352 when the flexible display 351 is unfolded.

In this case, a flexible frame 320 may be disposed on a rear surface of the flexible member 390. In other words, the flexible member 390 is disposed between the flexible display 351 and the flexible frame 320.

Referring to FIG. 10, the first flexible portion 321 and the second flexible portion 322 of the flexible frame 320 is disposed at an intermediate portion of the flexible frame 320 to support the bent portion 352 of the flexible display 351. The first flexible portion 321 and the second flexible portion 322 may be a portion in which through holes are arranged, as a flexible region 325. In this case, it may be a portion in which the first flexible portion 321 is bent at a first curvature, and the second flexible portion 322 (see FIG. 6) is bent at a second curvature. Here, rigid portions 326 may be disposed at both sides of the flexible region 325. The rigid portions 326 are disposed to cover the first body 201 and the second body 302 to support the flexible display 351 in a flat state at both sides of the bent portion 352.

The flexible member 390 may be formed of a rubber material and may include silicon or the like. The magnetic material 391 may be mixed into the rubber material in the form of magnet powder. For such an example, the flexible member 390 may be a rubber magnet sheet, a ferromagnetic etching sheet, or the like.

According to the illustration, a magnet 393 may be disposed at a position spaced apart from the flexible member 390, and the bent portion 352 may be pressurized by a magnetic force of the magnet 393 and the magnetic material 391. More specifically, the magnet 393 may be disposed to be spaced apart from the flexible frame 320, and the flexible member 390 may be made at a size corresponding to the bent portion 352, and disposed in the flexible region 325.

In the present example, the mobile terminal is configured to transmit a magnetic force generated between the magnet 393 and the flexible member 390 to the bent portion 352 of the flexible display 351. For example, the magnet 393 is configured to have the same polarity as the magnetic material 391 so as to generate a repulsive force. For another example, the magnet 393 has a polarity opposite to the magnetic material 391 to generate an attractive force. Whether an attractive or repulsive force is used to maintain the flatness of the bent portion 352 may be determined according to the surrounding structure.

According to the above-described structure, a force is applied to the bent portion 352 of the flexible display 351 through a magnetic force in a vacant space defined below the bent portion 352 of the flexible display 351. In this manner, the sagging of the flexible display 351 is restricted due to the magnetic force to prevent waves from being generated.

In addition, a relative position of the magnet 393 may be varied between the folding and unfolding by a relative movement between the flexible display 351 and the housing 312. In this case, the magnet 393 may be disposed to face the bent portion 352 in the first configuration. Through this structure, a magnetic force may be applied to the bent portion 352 only when unfolded. Through the above-described structure, a mechanism may be implemented in which a repulsive force is generated in an unfolded state to prevent sagging or waves from being generated on the flexible display, and the repulsive force is released in a folded state.

The configurations and methods according to the above-described embodiments will not be applicable in a limited way to the foregoing flexible display device, and all or part of each embodiment may be selectively combined and configured to make various modifications thereto.

What is claimed is:

1. A flexible display device, comprising:
    a first body having a first surface and a second surface opposite the first surface;
    a second body having a first surface and a second surface opposite the first surface, the second body having a housing;
    a hinge portion connecting the first body and the second body in a relatively rotatable manner; and
    a flexible display disposed on the first surface of the first body and first surface of the second body, the flexible display being movable between a folded state and an unfolded state, the flexible display being exposed to cover the second surface of the first body together with the second body when in the folded state,
    wherein the housing of the second body is slidable with respect to the hinge portion when the flexible display is moved between the folded state and the unfolded state,
    wherein the hinge portion comprises a plurality of hinge segments sequentially arranged along a first direction,
    wherein the hinge segments are arranged to surround a first side surface of the first body extending between the first surface and the second surface when the flexible display is in the folded state, wherein at least part of the hinge portion varies in length between the folded state and the unfolded state, and wherein the housing of the second body slides with respect to the hinge portion when the flexible display is moved between the folded state and the unfolded state to compensate for a length variation of the hinge portion.

2. The flexible display device of claim 1, wherein a distance between the first surface and the second surface of the first body at the first side surface is greater than a distance between the first surface and the second surface of the second body.

3. The flexible display device of claim 1, wherein the hinge segments are arranged such that a distance between first end portions of the hinge segments closest to the flexible display varies as the flexible display moves between the folded state and the unfolded state, and wherein the first body and the second body slide relative to each other as the distance between first end portions of the hinge segments is varied.

4. The flexible display device of claim 3, wherein, as the flexible display moves from the unfolded state to the folded state, the distance between the first end portions of the hinge segments increases with respect to a rotational center of the hinge segments, and wherein the flexible display is disposed to cover the first end portions of the hinge segments.

5. The flexible display device of claim 3, wherein, the hinge segments are arranged such that a distance between second end portions of the hinge segments spaced from the first end portions varies as the flexible display moves between the folded state and the unfolded state.

6. The flexible display device of claim 5, wherein, as the flexible display moves from the unfolded state to the folded state, the distance between the second end portions of the hinge segments decreases with respect to a rotational center of the hinge segments.

7. The flexible display device of claim 1, wherein one hinge segment of the plurality of hinge segments is connected to a sliding plate slidably inserted into the housing of the second body.

8. The flexible display device of claim 7, wherein the one hinge segment is integrally formed with the sliding plate.

9. The flexible display device of claim 1, wherein the flexible display is fixed to the housing of the second body, and wherein a sliding plate is slidably connected to the housing of the second body, the sliding plate extending from the hinge portion to compensate for the length variation of the hinge portion.

10. The flexible display device of claim 9, further comprising an elastic member disposed in the housing of the second body to provide an elastic force to the sliding plate.

11. The flexible display device of claim 10, further comprising an actuator connected to the sliding plate and at least part of the first body to pull the sliding plate in a direction toward the hinge portion, wherein the elastic member provides the elastic force to the sliding plate in a direction away from the hinge portion.

12. The flexible display device of claim 11, wherein the actuator comprises:

a plurality of extensions extending from the first body toward the sliding plate through the hinge portion; and a connection portion disposed in a direction perpendicular to the extensions to connect the extensions to one another.

13. The flexible display device of claim 12, wherein the connection portion is coupled to the sliding plate.

14. The flexible display device of claim 11, wherein the first body includes:

a housing; and a support plate connected to the actuator, and wherein the support plate is slidably coupled to the housing of the first body.

15. The flexible display device of claim 14, wherein the first body includes an elastic member in the housing of the first body to apply an elastic force to the support plate.

16. A flexible display device, comprising:

a first body having a first surface and a second surface opposite the first surface;

a second body having a first surface and a second surface opposite the first surface, the second body having a housing;

a hinge portion connecting the first body and the second body in a relatively rotatable manner; and a flexible display disposed on the first surface of the first body and first surface of the second body, the flexible display being movable between a folded state and an unfolded state, the flexible display being exposed to cover the second surface of the first body together with the second body when in the folded state, wherein the housing of the second body is slidable with respect to the hinge portion when the flexible display is moved between the folded state and the unfolded state, wherein the flexible display includes a bendable region that is bent when the flexible display moves from an unfolded state to the folded state, wherein a flexible member is disposed on a rear surface of the flexible display to pressurize the bendable region, the flexible member including a magnetic material, and wherein a magnet is disposed at a position separated from the flexible member when the flexible display is in the unfolded state.

17. The flexible display device of claim 16, wherein a flexible frame is disposed on the rear surface of the flexible member, and wherein the magnet is spaced apart from the flexible frame.

18. The flexible display device of claim 17, wherein the flexible member is disposed between the flexible display and the flexible frame.

* * * * *